United States Patent [19]
Sahara et al.

[11] 4,184,176
[45] Jan. 15, 1980

[54] AMPLIFIER HAVING DIFFERENT LOW-FREQUENCY AND HIGH-FREQUENCY FEEDBACK NETWORKS

[75] Inventors: Hiroshi Sahara; Yutaka Tanaka, both of Yokohama; Toshinobu Isobe, Tokyo, all of Japan

[73] Assignee: Sony Corporation, Tokyo, Japan

[21] Appl. No.: 874,614

[22] Filed: Feb. 2, 1978

[30] Foreign Application Priority Data

Feb. 16, 1977 [JP] Japan .................... 52-15962

[51] Int. Cl.² .................... H04N 5/14; H03F 3/45; H03F 1/34
[52] U.S. Cl. .................... 358/184; 330/260; 330/292; 330/294; 330/293
[58] Field of Search .............. 358/184, 242, 21, 39, 358/40, 65; 330/103, 260, 265, 271, 291–294

[56] References Cited

U.S. PATENT DOCUMENTS 3,676,790  7/1972  Beurrier ........................ 330/260
3,983,505  9/1976  Ishigaki et al. ................. 330/103
4,069,459  1/1978  Lee ............................ 330/103

OTHER PUBLICATIONS

Lefkowitz, "Transistor AC Amplifier Uses Multiple Feedback", *Electronics* (Engineering Edition), May 23, 1958, pp. 84, 85.

*Primary Examiner*—John C. Martin
*Attorney, Agent, or Firm*—Lewis H. Eslinger; Alvin Sinderbrand

[57] ABSTRACT

A feedback amplifier, particularly suitable for use in the video output circuit of a television receiver, has an amplifying circuit, for example, in the form of a differential amplifier, a first feedback circuit for negatively feeding back to the input of the amplifying circuit a low frequency component of the output signal from the amplifying circuit, and a second feedback circuit having substantially the same feedback ratio as the first feedback circuit but being operative to negatively feedback to the input of the amplifying circuit a high frequency component of the output signal.

4 Claims, 4 Drawing Figures

AMPLIFIER HAVING DIFFERENT LOW-FREQUENCY AND HIGH-FREQUENCY FEEDBACK NETWORKS

BACKGROUND OF THE INVENTION

1. Field of the Invention

This invention relates generally to feedback amplifiers and, more particularly, is directed to an improved feedback amplifier especially suited for use in the video output circuit of a television receiver.

2. Description of the Prior Art

In some existing amplifiers, a negative feedback circuit is provided between the output and input of the amplifying circuit for stabilizing the amplifying operation or for preventing oscillation of the circuit as a result of the positive feedback action occurring, for example, through a stray capacitance between the input and output of the amplifying circuit. A correct and effective negative feedback operation can be achieved only if the phase of the feedback signal is accurately maintained so as to be precisely opposite to the phase of the input signal.

The feedback circuit is usually composed of passive elements and, if the elements of the feedback circuit are all pure resistors, the phase characteristic of the feedback signal and, therefore, the frequency characteristic of the output signal, can be maintained constant without regard to frequency variations of the input signal. However, in actual fact, due to stray capacitance in the feedback circuit, the phase of the feedback signal varies with changes in the frequency of the input signal. The foregoing is particularly a problem if the frequency of the input signal varies often over a wide range, for example, as is the case when the input signal applied to the amplifying circuit is a video signal. In such case, the frequency characteristic of the output signal is not flat and only a particular frequency component of the signal, for example, a relatively low frequency component, is stressed in the output. Thus, with the existing feedback circuit, a very unstable condition or oscillation may occur because of the fluctuation of the phase characteristic of the feedback signal.

When the feedback circuit is formed by a plurality of resistors connected in series between the amplifying circuit output and ground to form a resistance divider circuit and the feedback signal is obtained at a connection point between the resistors, the stray capacitance can be considered to be in parallel with the resistor at the cold side, that is, between the connection point and ground. In such case, the previously mentioned problems can be minimized, that is, the described effects of the stray capacitance can be made negligible, if the resistor in parallel with the stray capacitance is given a small value relative to the impedance of the stray capacitance. However, for any predetermined value of the negative feedback ratio, the relation of the resistance value of the hot side resistor of the resistance divider circuit to the resistance value of the previously mentioned cold side resistor in parallel with the stray capacitance is also predetermined. Thus, providing the cold side resistor with a small resistance value requires that the hot side resistor be similarly provided with a small resistance value, with the result that the composite resistance value of the resistors becomes very small and causes a reduction of the dynamic range of the amplifier. Therefore, in existing feedback amplifiers employing a resistance divider circuit for the feedback, the resistors in such resistance divider circuit have been given intermediate values that are compromises between the small resistance values desired for avoiding fluctuation of the phase characteristic of the feedback signal and the relatively high resistance values required for increasing the dynamic range of the amplifier.

OBJECTS AND SUMMARY OF THE INVENTION

Accordingly, it is an object of this invention to provide a feedback amplifier that avoids the above-described difficulties encountered with the prior art.

More particularly, it is an object of this invention to provide a feedback amplifier of relatively large dynamic range in which the phase of the feedback signal does not vary in response to changes in the frequency of the input signal.

Another object is to provide a feedback amplifier, as aforesaid, which is of relatively simple construction, and which may be conveniently employed in the video output circuit of a television receiver.

In accordance with an aspect of this invention, a feedback amplifier has an amplifying circuit, for example, in the form of a differential amplifier, a first feedback circuit for negatively feeding back to the input of the amplifying circuit a low frequency component of the output signal from the amplifying circuit, and a second feedback circuit having substantially the same feedback ratio as the first feedback circuit but being operative to negatively feedback to the input of the amplifying circuit a relatively high frequency component of the output signal.

It is a further feature of the invention that the first feedback circuit and/or the second feedback circuit includes a resistance divider circuit connected between the output of the amplifying circuit and ground and having an intermediate or connection point between the respective resistors which is connected to the input of the amplifying circuit.

The above, and other objects, features and advantages of the invention, will be apparent in the following detailed description of illustrative embodiments of the invention which is to be read in connection with the accompanying drawings.

DETAILED DESCRIPTION OF PREFERRED EMBODIMENTS

Figure 1:
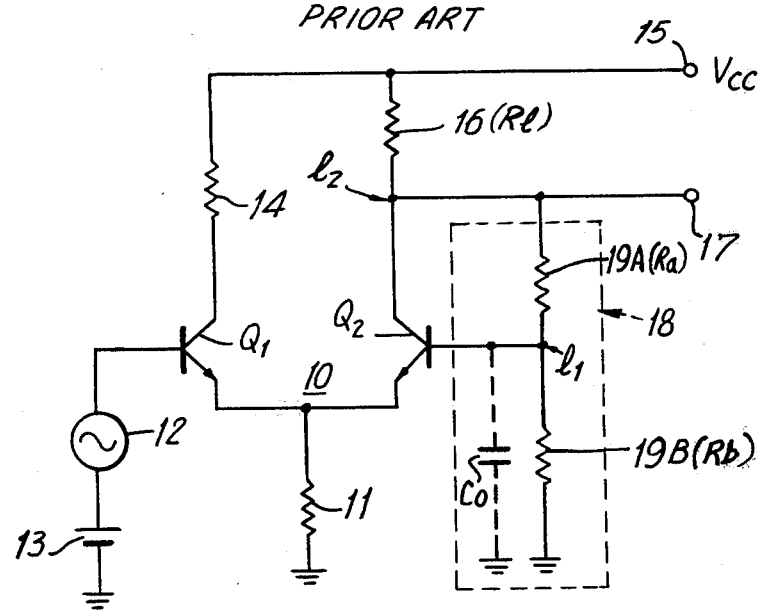
FIG. 1 is a circuit wiring diagram illustrating a feedback amplifier according to the prior art.

Referring to the drawings in detail, and initially to FIG. 1 thereof, it will be seen that, in the prior art feedback amplifier there illustrated, a pair of transistors $Q_1$ and $Q_2$ are connected together to form a differential amplifier 10. More particularly, the emitter electrodes of transistors $Q_1$ and $Q_2$ are connected together to a resistor 11 and through the latter to ground, while the input signal from a source 12 is applied to the base electrode of transistor $Q_1$ along with a suitable D.C. bias from a source 13. The collector electrode of transistor $Q_1$ is connected through a resistor 14 with a terminal 15 receiving an operating voltage $V_{cc}$, and the collector electrode of transistor $Q_2$ is connected through a load resistor 16 with the operating voltage terminal 15. An output terminal 17 is connected with the collector electrode of transistor $Q_2$, as at $l_2$, and the output signal obtained at terminal 17 is negatively fed back to the base electrode of transistor $Q_2$ by way of a feedback circuit 18. As shown, feedback circuit 18 includes series connected resistors 19A and 19B constituting a resistance divider circuit and having a connection point $l_1$ between resistors 19A and 19B connected to the base electrode of transistor $Q_2$. Thus, the part of the output signal obtained at the connection point $l_1$ between resistors 19A and 19B is fed back to the base of transistor $Q_2$.

A stray capacitance $C_o$, which may be constituted by a composite of a mirror integrated stray capacitance between the base and collector of transistor $Q_2$, the stray capacitance of a printed circuit board, and the usual output capacitor, and which is inevitable in a feedback amplifier of the type being described, is shown to be, in effect, in parallel with the cold side resistor 19B of feedback circuit 18.

If the voltage gain of differential amplifier 10 is A in the absence of the feedback circuit 18 and the feedback ratio is $\beta$, then the total gain G of the feedback amplifier is as follows:

$$G = \frac{A}{1 - A\beta} \div -\frac{1}{\beta} \quad (1)$$

The feedback ratio $\beta$ is mainly determined by the ratio of the resistance values $R_a$ and $R_b$ of the resistors 19A and 19B, respectively. However, due to the existance of the stray capacitance $C_o$, the feedback ratio $\beta$ is expressed as follows:

$$\beta = (-Z)/(R_a + Z) \quad (2)$$

in which $Z = R_b \parallel 1/j\omega C_o$, that is, Z is the impedance due to the resistance of the resistor 19B in parallel with the capacitive reactance of the stray capacitance $C_o$. Therefore, the impedance value Z can be written $$Z = \frac{R_b \cdot [\frac{1}{j\omega C_o}]}{R_b + \frac{1}{j\omega C_o}} \quad (3)$$

in which $\omega = 2\pi f$ (f being the frequency of the signal) and $1/j$ or $-j$ indicates a capacitive reactance.

Equation (3) can be rewritten as:

$$Z = \frac{1}{1/R_b + j\omega C_o} \quad (4)$$

By substituting for Z in equation (2) the term given in equation (4), the feedback ratio $\beta$ can be expressed as follows:

$$\beta = \frac{-R_b}{R_a + R_b + R_a \cdot R_b \cdot j\omega C_o} \quad (5)$$

Accordingly, the phase of the output signal at the connection point $l_1$, that is, the phase of the feedback signal, varies with changes in the frequency of the input signal. Therefore, the phase of the feedback signal is not always identical with the phase of the output signal at the connection point $l_2$ and, hence, at the output terminal 17. By reason of the foregoing, the phase characteristic of the output signal varies with changes in the frequency of the input signal so that the feedback signal is not always precisely negatively fed back to the input of the amplifying circuit with the result that an unstable condition, such as, an undesired oscillation, may occur.

In order to prevent such undesirable oscillation of the amplifying circuit, the resistance value $R_b$ of resistor 19B in feedback circuit 18 must be made small enough so as to make negligible the effect of the stray capacitance $C_o$. However, since resistors 19A and 19B are connected through load resistor 16 to the terminal 15 having the operating D.C. voltage $V_{cc}$ applied thereto, a D.C. current flows continuously through load resistor 16. Therefore, the maximum collector voltage of transistor $Q_2$ is lowered by the value $(R_l)/(R_a + R_b + R_l) \cdot V_{cc}$, in which $R_l$ is the resistance value of load resistor 16. It will be apparent from the foregoing that, from the standpoint of the power consumption and the dynamic range of the feedback amplifier, the resistors 19A and 19B are preferably provided with high resistance values $R_1$ and $R_b$, whereas, as previously mentioned, the resistance value $R_b$ of resistor 19B must be small in order to stabilize the phase characteristic of the output signal. Thus, in the prior art, it has been the usual practice to provide the resistors 19A and 19B with resistance values that are intermediate the high values desired for reducing power consumption and increasing the dynamic range and the low values required for stabilizing the phase characteristic of the output signal.

Figure 2:
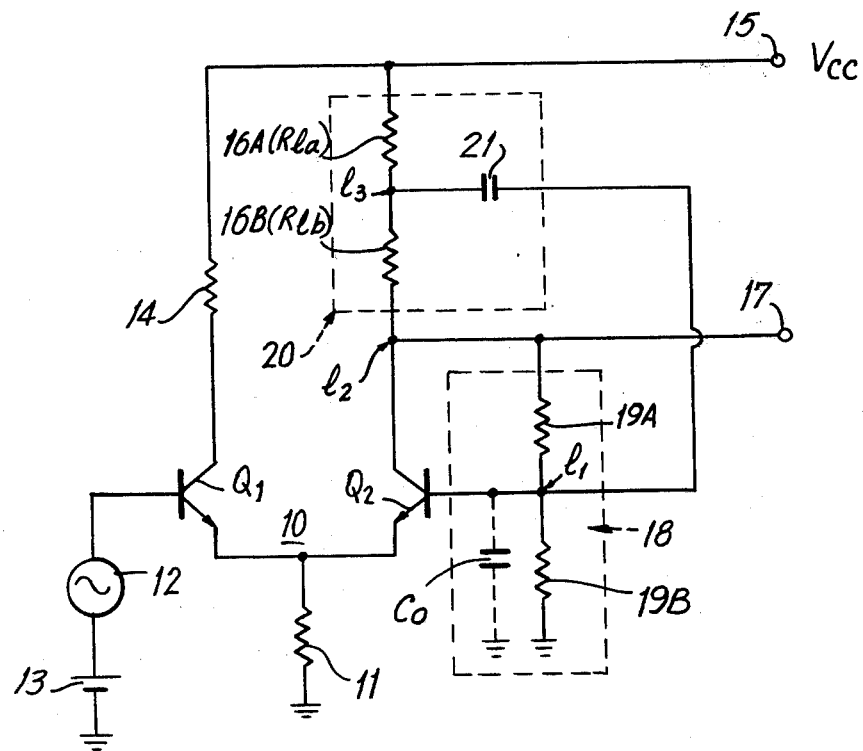
FIG. 2 is a circuit wiring diagram similar to FIG. 1, but showing an embodiment of the present invention.

Referring now to FIG. 2, it will be seen that, in a feedback amplifier according to this invention, elements corresponding to those described above with reference to the prior art amplifier of FIG. 1 are identified by the same reference numerals. In the feedback amplifier of FIG. 2, the feedback circuit 18 is employed for feeding back a low frequency component of the output signal, and an additional feedback circuit 20 is connected in parallel with the feedback circuit 18 and is employed for feeding back a high frequency component of the output signal. More particularly, in the embodiment of the present invention illustrated on FIG. 2, the load resistor for differential amplifier 10 is constituted by two resistors 16A and 16B forming a resistance divider circuit of feedback circuit 20 which further includes a capacitor 21 connected between a connection point $l_3$ of resistor 16A with resistor 16B and the connection point $l_1$ which is, in turn, connected with the base electrode of transistor $Q_2$.

Figure 3:
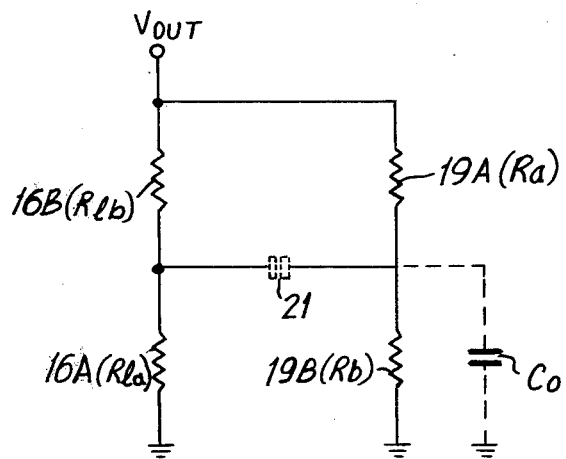
FIG. 3 is an A.C. equivalent circuit of two feedback circuits included in the feedback amplifier according to this invention as shown on FIG. 2.

As is evident from the A.C. equivalent circuit of feedback circuits 18 and 20 shown on FIG. 3, if the input signal is in a low-frequency range, the feedback path for the output signal is mainly through the resistors 19A and 19B. With the impedance Z of feedback circuit 18 being determined by equation (4) above, it will be apparent that, if the term $1/R_b$ is large in comparison to the term $\omega C_o$, in other words, if the resistance value $R_b$ is small in comparison with the capacitive reactance of the stray capacitor $C_o$, then the impedance Z of the feedback circuit 18 can be considered a pure resistance and the stray capacitance $C_o$ can be ignored.

In accordance with this invention, the resistor 19B is provided with a resistance value $R_b$ which is small in comparison to the capacitive reactance of the stray capacitance $C_o$ and, therefore, the feedback ratio $\beta_L$ of feedback circuit 18 for an input signal in the low frequency range can be expressed as follows:

$$\beta_L = (-R_b)/(R_a + R_b) \qquad (6)$$

Accordingly, the influence of the stray capacitance $C_o$ on the phase characteristic of the output signal is eliminated for input signals in the low frequency range.

On the other hand, when the input signal is in a high frequency range, the impedance of capacitor 21 in feedback circuit 20 is so small that capacitor 21 can be considered to be short circuited. If it is assumed that the resistors 16A and 16B have resistance values $R_{la}$ and $R_{lb}$, respectively, which are small in comparison with the resistance value $R_1$ of resistor 19A and the impedance $Z$ of feedback circuit 18, then the existence of resistors 19A and 19B can be neglected in respect to input signals in the high frequency range. Therefore, for an input signal in the high frequency range, the feedback path for the output signal is mainly formed by load resistors 16A and 16B, that is, a part of the output signal is fed back to the base electrode of transistor $Q_2$ through feedback circuit 20. The feedback ratio $\beta_H$ of feedback circuit 20 can be expressed as follows:

$$\beta H = -\frac{R_{la}}{R_{la} + R_{lb}} \qquad (7)$$

In accordance with the present invention, the feedback ratios $\beta_L$ and $\beta_H$ of the feedback circuits 18 and 20 are selected to be substantially equal to each other so that the frequency characteristic of the feedback amplifier can be maintained constant. In a practical example of this invention, it has been found that the foregoing conditions are satisfied when the resistors 19A, 19B and 16A and 16B have the following resistance values:
$R_a = 270$ KΩ
$R_b = 5$ KΩ
$R_{la} = 222$ Ω
$R_{lb} = 12$ KΩ

By way of summary, it will be noted that, in a feedback amplifier according to this invention, two feedback circuits 18 and 20 are connected in parallel with each other for feeding back low and high frequency components, respectively, of the output signal, and such feedback circuits 18 and 20 are provided with substantially equal feedback ratios $\beta_L$ and $\beta_H$. By reason of the foregoing, the phase of the feedback signal can be maintained substantially constant regardless of changes in the frequency of the input signal and instability of the amplifying circuit, such as, oscillation thereof or deterioration of its frequency characteristic, can be substantially prevented. Furthermore, the composite resistance value of resistors 19A and 19B can be selected to be large relative to the composite resistance value of load resistors 16A and 16B so as to reduce the power consumption of the amplifier and further to increase the dynamic range thereof.

Figure 4:
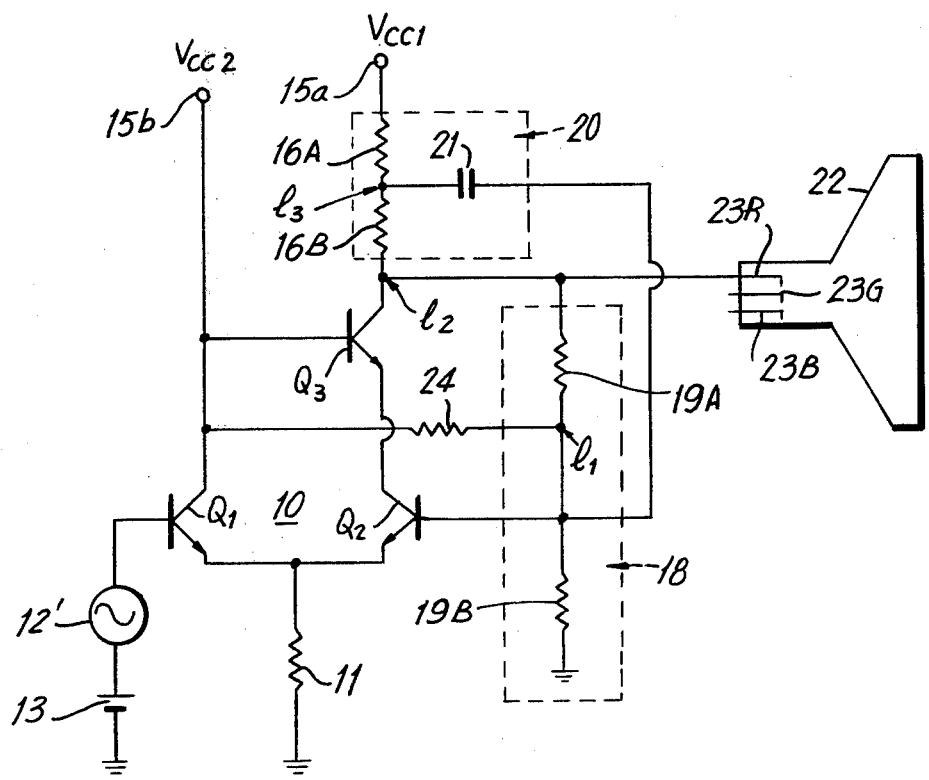
FIG. 4 is a circuit wiring diagram illustrating the application of the feedback amplifier according to this invention to a video output circuit of a color television receiver.

The previously described characteristics of the feedback amplifier according to this invention makes the same especially suited for inclusion in the video output circuit of a television receiver. For example, as shown on FIG. 4, a feedback amplifier according to this invention may form part of a video output circuit of a color television receiver having a conventional color cathode ray tube 22 which is schematically shown to have control electrodes 23R, 23G and 23B for receiving respective color or drive signals by which the intensities of electron beams for producing red, green and blue images are respectively modulated. In FIG. 4, in which elements of the feedback amplifier corresponding to those previously described with reference to FIG. 2 are identified by the same reference numerals, only the video output circuit for one color signal is shown, that is, only the video output circuit for the "red" color signal is shown, and it will be understood that the color television receiver would have similar video output circuits for the "green" and "blue" color signals.

More particularly, in the circuit shown on FIG. 4, the input signal source 12' is a color signal source, for example, an output of a conventional matrix circuit (not shown) to which a luminance signal and color difference signals are supplied so as to derive therefrom the "red", "green" and "blue" color signals for controlling the color cathode ray tube 22. Further, in the circuit shown on FIG. 4, a video output transistor $Q_3$ has its collector-emitter path connected between the load resistors 16A, 16B in feedback circuit 20 and the collector electrode of transistor $Q_2$. Thus, an output signal at the collector electrode of video output transistor $Q_3$ is fed back through feedback circuits 18 and 20 to the base electrode of transistor $Q_2$ which, with transistor $Q_1$, forms the differential amplifier 10.

In the embodiment of the invention presently being described, a relatively high D.C. voltage $V_{cc1}$, for example, of 200 to 300 V., is supplied to an operating voltage terminal 15a which is connected to the collector electrode of transistor $Q_3$ through the load resistors 16A and 16B, while a relatively low D.C. voltage $V_{cc2}$, for example, of 10 to 20 V., is applied to an operating voltage terminal 15b which is connected to the collector electrode of transistor $Q_1$. By reason of the foregoing, only the video output transistor $Q_3$ has to be capable of withstanding a relatively high voltage, while the transistors $Q_1$ and $Q_2$ forming the differential amplifier 10 need to withstand only a relatively low voltage.

Finally, in the feedback amplifier of FIG. 4, a resistor 24 is connected between the connection point $l_1$ in feedback circuit 18 and the collector electrode of transistor $Q_1$ to which the base electrode of transistor $Q_3$ is connected. The resistor 24 determines the D.C. bias for the transistor $Q_3$ and the D.C. level of the output signal from the feedback amplifier.

It will be apparent that, when a feedback amplifier according to the present invention is incorporated in the video output circuit of a television receiver, as in FIG. 4, the phase characteristic of the respective color or drive signal for the cathode ray tube is stable, and the power consumption of the amplifier is reduced while providing the amplifier with a large dynamic range. Furthermore, since the feedback ratios $\beta_L$ and $\beta_H$ of the feedback circuits 18 and 20 are made to be equal, the frequency characteristic of the output signal can be flat so as to ensure that the cathode ray tube 22 will reproduce a stable picture.

It will be appreciated that the described application of the invention to the video output circuit of a color television receiver is merely illustrative, and that the feedback amplifier according to this invention may have many other applications. Moreover, the differential amplifying circuit 10 of the illustrated embodiments is merely illustrative of one type of amplifying circuit to which the invention can be applied, and feedback amplifiers embodying the invention can employ other types of amplifying circuits.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A feedback amplifier comprising: amplifying circuit means including input means for receiving an input signal, output means for providing an amplified output signal, first and second transistors each having base, emitter and collector electrodes with said input signal being applied to said base electrode of said first transistor, means for applying operating voltages to the collector electrodes of said transistors, and means for connecting together the emitter electrodes of said transistors to ground, said output means being connected with said collector electrode of the second transistor;

first feedback circuit means connected between said output means and said input means for negatively feeding back a low frequency component of said output signal, said first feedback circuit means including first and second resistors connected in series between said output means and ground, and means connecting a connection point between said first and second resistors to said base electrode of said second transistor; and second feedback circuit means connected between said output means and said input means for negatively feeding back a high frequency component of said output signal, said second feedback circuit means including third and fourth resistors connected in series to form an output load for said amplifying circuit means, and a capacitor connected between a connection point of said third resistor with said fourth resistor and said base electrode of the second transistor, said second feedback circuit means and said first feedback circuit means having respective feedback ratios that are substantially equal to each other.

2. A feedback amplifier according to claim 1; in which said output means includes a third transistor having a collector-emitter path connected between said output load and said collector electrode of said second transistor, and a base electrode connected to said collector electrode of said first transistor;

said means for applying operating voltages includes a source of relatively high operating voltage connected through said output load to said collector-emitter path of the third transistor, and a source of relatively low operating voltage connected to said collector electrode of the first transistor; and resistance means between said connection point of the first and second resistors and said collector electrode of the first transistor for determining a D.C. bias of said third transistor and the D.C. level of said output signal.

3. In a television receiver including a cathode ray tube with a control electrode: a video output circuit comprising:

amplifying circuit means including input means for receiving an input video signal, output means for providing an amplified video signal to said control electrode, first and second transistors each having base, emitter and collector electrodes with said input video signal being applied to said base electrode of said first transistor, means for applying operating voltages to the collector electrodes of said transistors, and means for connecting together the emitter electrodes of said transistors to ground, said output means being connected with said collector electrode of the second transistor;

first feedback circuit means connected between said output means and said input means for negatively feeding back a low frequency component of said amplified video signal, said first feedback circuit means including first and second resistors connected in series between said output means and ground, and means connecting a connection point between said first and second resistors to said base electrode of said second transistor; and second feedback circuit means connected between said output means and said input means for negatively feeding back a high frequency component of said amplified video signal, said second feedback circuit means including third and fourth resistors connected in series to form an output load for said amplifying circuit means, and a capacitor connected between a connection point of said third resistor with said fourth resistor and said base electrode of the second transistor, said second feedback circuit means and said first feedback circuit means having respective feedback ratios that are substantially equal to each other.

4. A television receiver according to claim 3; in which said output means includes a video output transistor having a collector-emitter path connected between said output load and said collector electrode of said second transistor, and a base electrode connected to said collector electrode of said first transistor;

said means for applying operating voltages includes a source of relatively high operating voltage connected through said output load to said collector-emitter path of the video output transistor, and a source of relatively low operating voltage connected to said collector electrode of the first transistor; and resistance means between said connection point of the first and second resistors and said collector electrode of the first transistor for determining a D.C. bias of said video output transistor of the D.C. level of said amplified video signal.

* * * * *